United States Patent [19]

Makino et al.

[11] Patent Number: 5,153,707
[45] Date of Patent: Oct. 6, 1992

[54] FILM MATERIAL FOR MANUFACTURING FILM CARRIERS HAVING OUTER LEAD PORTIONS WITH INNER AND OUTER METALLIC LAYERS

[75] Inventors: Yutaka Makino, Kobe; Kazumi Ishimoto, Katano; Yasuo Izumi, Ikoma; Yuji Uesugi, Osaka, all of Japan

[73] Assignee: Matsushita Electric Industrial Co., Ltd., Osaka, Japan

[21] Appl. No.: 610,046

[22] Filed: Nov. 6, 1990

[30] Foreign Application Priority Data

Nov. 6, 1989 [JP] Japan ................................. 1-288340
Nov. 6, 1989 [JP] Japan ................................. 1-288341

[51] Int. Cl.⁵ ............................................ H01L 23/54
[52] U.S. Cl. ............................................ 357/70
[58] Field of Search ................... 357/70; 437/209, 206

[56] References Cited

U.S. PATENT DOCUMENTS 3,544,857 12/1970 Byrne et al. ........................ 437/217
4,551,912 11/1985 Marks .................................. 437/209
4,800,419 1/1989 Long et al. ........................... 357/70
4,806,503 2/1989 Yoshida et al. ..................... 437/206

FOREIGN PATENT DOCUMENTS

2-9158 1/1990 Japan ..................................... 357/72

Primary Examiner—Rolf Hille
Assistant Examiner—S. V. Clark
Attorney, Agent, or Firm—Wenderoth, Lind & Ponack

[57] ABSTRACT

A film material for manufacturing film carriers and its manufacturing method wherein the film material common in all may be applied with respect to the various semiconductor chips which are different in the electrode layout, because the inner lead portions for bump connection use which are required to be changed each time the electrode layout of the semiconductor chip changes are not pattern formed, and are kept as the inner lead forming portion with the whole remaining covered with the conductive metallic layer, and, the manufacturing apparatus for etching mask and model and so on have only to be one in type.

4 Claims, 7 Drawing Sheets

FILM MATERIAL FOR MANUFACTURING FILM CARRIERS HAVING OUTER LEAD PORTIONS WITH INNER AND OUTER METALLIC LAYERS

BACKGROUND OF THE INVENTION

The present invention relates to a film material for manufacturing film carriers and its manufacturing method, and more particularly, to a film material which becomes a material in manufacturing the film carriers for mounting semiconductor chips, and a method of manufacturing the film material.

There is known a film carrier system referred to as the package construction of semiconductor chips such as IC, LSI and so on. This is produced by a method comprising the steps of forming a conductive metallic layer of Cu foil or the like on the film tape, effecting an etching operation on the conductive metallic layer to form lead patterns for manufacturing the film carriers, punching, separating the film carriers for each of the individual lead patterns after bonding the semiconductor chips to the lead patterns on the film carriers, and obtaining the film carrier chips with the semiconductor chips mounted being thereon.

Figure 6A:
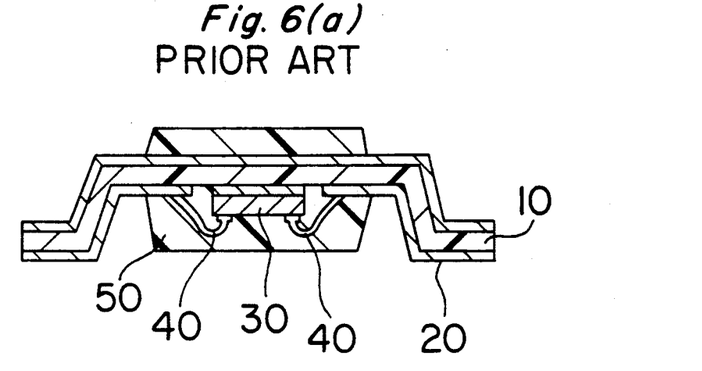
Figure 6B:
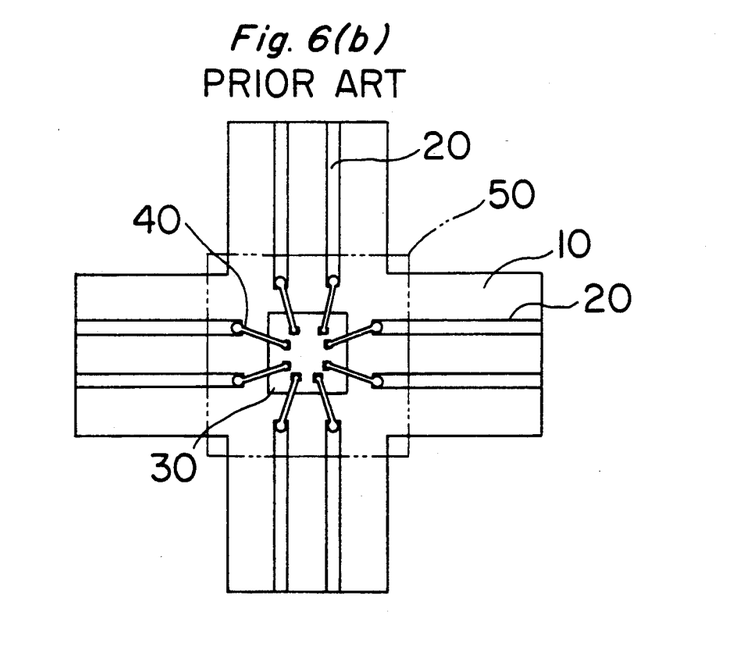
Figure 7A:
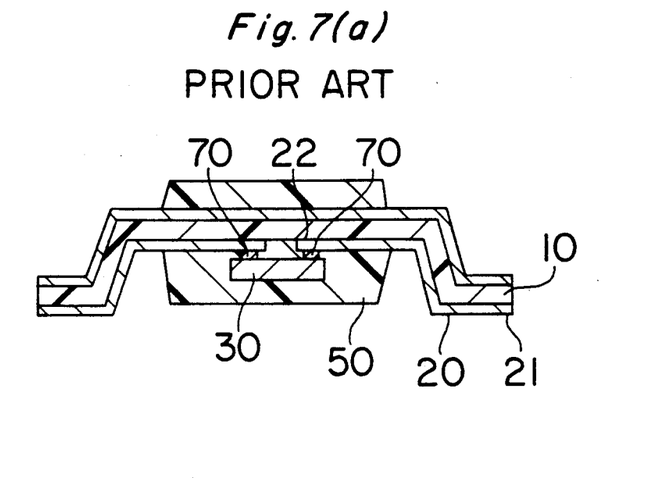
Figure 7B:
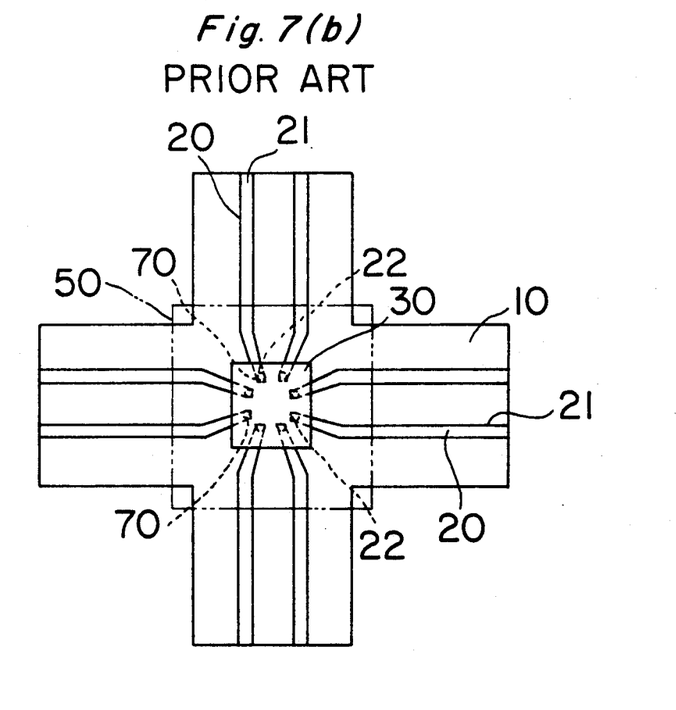

FIG. 6 and FIG. 7 show the construction of representative known film carrier chips. FIG. 6 shows a bonding wire type of film carrier chip with the connection between the semiconductor chip and the lead pattern of the film carrier being effected with bonding wires. The lead pattern 20 composed of conductive metallic layer of Cu or the like is formed in the given pattern shape on the film 10 made of polyimide resin or the like. After the the semiconductor chip 30 has been fixedly mounted by the means of soldering, bonding or the like on the film 10, the respective electrodes and the lead pattern 20 are electrically connected with the bonding wires 40. The periphery of the semiconductor chip 30 is covered with the sealing resin 50.

FIG. 7 shows a bump type of film carrier chip which effects with bumps the connection of the semiconductor chip and the lead pattern of the film carrier. The point of difference between FIG. 6 and FIG. 7 is that the lead pattern 20 extends as far as each electrode position on the reverse face of the semiconductor chip 30, the lead patterns 20 and the respective electrodes are electrically connected with each other through the bumps 70 made of Au, solder or the like on the extended lead pattern 20 and the semiconductor chip 30 itself is secured onto the film 10.

In the case of the wire bonding type, it is inconvenient to connect the respective electrodes of the semiconductor chip 30 respectively with the lead pattern 20 by bonding wires 40 and also, sufficient intervals among the electrodes are required to effect the wire bonding operation, with a problem that the whole plane size of the electrode intervals and the semiconductor chip 30 become larger. Also, as the bonding wires 40 are projected from the surfaces of the semiconductor chip 30, the external shape of the sealing resin 50 becomes larger to completely cover the whole of the bonding wires 40, with the defect that the height of the whole film carrier chip becomes larger.

On the other hand, in the case of the bump type, effect the heating and pressing operations are collectively effected with the bump 70 being grasped between the electrodes of the semiconductor chip 30 and the lead patterns 20, and all the connections may be effected at one time and the connecting operation may be extremely efficient. As the connection may be effected if the intervals among the electrodes are narrower, the area of the electrode intervals, namely, the semiconductor chip 30 may be made smaller. The bump 70 is hidden on the reverse face of the semiconductor chip 30, and also, is slight in thickness, so that the bump becomes thinner even in the thickness direction. As a result, the size of the whole film carrier chip may be made smaller.

As the bump type is superior to the wire bonding type for the above described reasons, it is used for smaller types of packages.

But the bump type of film carrier chip had a disadvantage in that no flexibility was provided with respect to the electrode layout of the semiconductor chip 30.

Namely, the outer lead portion 21 for the connection to the external circuit of wiring basic plate or the like among the lead patterns 20 of the film carrier chip may be used as it is into the various mounted forms if it is kept set to the constant standard size. As the electrode layout of the semiconductor chip 30 is completely different depending upon the construction of the individual semiconductor chip 30, the inner lead portion 22 of the lead pattern 20 has to be formed in accordance with the electrode layout of the semiconductor chip 30, namely, the layout of the bump 70.

Therefore, in the film 10 provided with the lead pattern 20 having a constant pattern of inner lead portion 22, namely, the film carrier, the film carrier provided with the lead pattern 20 different in the forming pattern had to be manufactured each time the electrode layout of the semiconductor chip 30 changes, because it cannot be used for the mounting use of the semiconductor chip 30 different in the electrode layout. When the forming pattern of the lead pattern 20 changes, the mask or model for etching use has to be prepared for each of the respective patterns, with problems that the apparatus cost is increased, the plan for the apparatus has to be changed for each of the pattern changes, and more operation time is required.

Especially in recent years, the number of the electrodes of the semiconductor chip has increased, and also, more product types and lower production runs are present which presents extremely important problems in that the long hours or lead time of manufacturing the mask for etching use, or the like is set each time the product type changes and the initial cost increases.

SUMMARY OF THE INVENTION

Accordingly, an essential object of the present invention is to provide a film material for manufacturing film carriers which is capable of easily coping with the variation in the electrode layout of the semiconductor chip in a film carrier for manufacturing a bump type of film carrier chip suitable for the smaller size of the semiconductor chip, higher efficiency of the mounting operation and so on.

Another important object of the present invention is to provide a method of manufacturing the film material.

In accomplishing these and other objects, the inventors of the present application invented such a film material for manufacturing film carriers as described hereinafter, and a manufacturing method of the film carrier using the film material.

A film material for manufacturing film carriers in accordance with the present invention is a film material for manufacturing the film carriers, wherein the respective electrodes of the semiconductor chip to be mounted on the above described film are connected through bumps with the inner lead portions of the lead pattern formed on the film, and which is characterized by the fact that the outer lead portions which remain the same depending upon the electrode layout of the semiconductor chip to be mounted among the lead patterns to be formed by the pattern formation from the conductive metallic layer on the above described film are pattern formed previously, and also, at least the solder portion is made of copper, the inner lead portions which change in pattern depending upon the electrode layout of the semiconductor chip to be mounted are an inner lead forming portion, without being pattern formed, with the conductive metallic layer made of a non-copper metal, which is lower in the reflection ratio with respect to the laser light than the copper, remaining as it is.

The film material for film carrier use is formed in a lead pattern through the etching operation into the given pattern shape after the conductive metallic layer of copper or the like has been formed on the surface of the film tape made of polyimide resin or the like, with such basic construction as described hereinabove being similar to that of the conventional normal film carrier film material.

In the invention, the given pattern formation is effected, as in the conventional example, about the outer lead portion which is provided in use for the connection with the external circuit. Also, the outer lead portions are made of copper in the soldering portion for connection with at least the external portion circuit. It is to be noted that the other portions may be composed of optional conductive metal if the soldering portion is copper. For example, one portion of the outer lead portion may be made of conductive metal or the other types of conductive metals for constituting the inner lead portions to be described. Also, the conductive metal for constituting the inner lead portions may be formed as far as the outer lead portions, and also, the surfaces thereof may be covered with copper. Needless to say, the whole of the outer lead portions may be made of copper, or may be made into the built in construction of copper and a metal except for the copper. In order to further improve the solder connecting property in the soldering portion, Au, Sn plating has only to applied on the copper in the solder portion only among the outer lead portions made of such copper as described hereinabove.

The inner lead portions to be connected with the electrodes of the semiconductor chip are made of a conductive metal which is lower in reflection ratio with respect to the laser light than the copper which constitutes the above described outer lead portion, and is superior in the laser working property. If the reflection ratio with respect to the laser light is lower, the absorption property of the laser light is better and the laser working property is better, so that the moving application of the laser light may be effected at higher speed and the working efficiency becomes higher. Al, Sn, Ni, Zn or the like is provided as a conductive metal of such superior laser working property. Although the reflection ratio with respect to the laser light of various types of metals is different depending upon the wavelength of the laser light, the wavelength of, for example, the YAG laser which is widely used in the normal laser working is approximately 1.06 $\mu$m. The reflection ratio of the copper and the above described metal with respect to the light of 0.9 through 11 $\mu$m in wave length becomes Al=73.3%, Sn=54.0%, Ni=72.0%, Zn=49.0% with respect to copper 90.1%, with every reflection ratio being smaller, the laser working property being better. In addition to the above described metals, a metal may be properly selected and used from the various types of conductive metals upon the consideration of the characteristics of the electric performance except for the wave length of the laser light to be used or the laser working property, the bump splicing property and so on.

The inner lead portions composed of conductive metal superior in such laser working property as described hereinabove are kept as the inner lead forming portion which is not pattern formed as in the conventional film carrier, and remains covered in whole with the conductive metal layer. Here the inner lead portions mean the portion where the pattern is required to be changed in accordance with the electrode layout of the conductive chip. The location where the pattern formation is not required to be changed by the electrode layout of the semiconductor chip if it is the inner side portion of the semiconductor chip is pattern formed as in the above described outer lead portions.

The film material provided with the above described outer lead portions, the inner lead forming portion and so on with the inner lead portions being not pattern formed, are offered for transportation custody or sales.

A method of manufacturing film carriers by the use of such film material as described hereinabove will be described hereinafter.

The pattern formation of the inner lead portions are effected in accordance with the electrode layout of the individual semiconductor chips to be mounted. The pattern formation of the inner lead portions is effected in accordance with the laser working operation. The working patterns of the laser working operation have only to be controlled in the application of the laser light ray by a program established in accordance with the electrode layout of the semiconductor chips in advance with the use of the NC working control apparatus or the like. The concrete laser working apparatus and working conditions are similar to the laser working in the normal semiconductor manufacturing, wiring circuit manufacturing and so on.

The film carriers which have completed the pattern formation of the inner lead portions go through a bump forming step of each electrode, a splicing bonding step through the bumps between the inner lead portions and the electrodes of the semiconductor chip, a sealing step with resin, punching, separating steps with respect to the individual film carrier chip, and so on as in the normal semiconductor chip mounting method, so that the film carrier chip as the object is manufactured.

Also, the manufacturing method of film material for manufacturing film carriers in accordance with the present invention comprises the steps of, in the manufacturing of the film materials for manufacturing the film carriers of the present invention, applying an etching operation of etching both the metals upon the built in materials with a cladding material with copper, and non copper metal which is lower in the reflection ratio with respect to the laser light than the copper being pasted on the film with the copper being provided on the surface side, thereafter applying a selection etching operation which etches the copper, but does not etch the non copper metal so as to expose the non copper metallic layer of the inner lead forming portion.

What may be used to manufacture the cladding material with respect to the copper is selected from among the above described respective conductive metals as the non copper metal which is lower in the reflection radio with respect to the laser light than the copper. The manufacturing means for the normal cladding material is adopted as the manufacturing method of the cladding material between the copper and the non copper metal. A method similar to the forming means of the conductive metallic layer on the film material in the conventional normal film carrier is used as a method of pasting the cladding material on the film material to manufacture the built in material.

The etching operation for pattern forming the outer lead portion and the inner lead forming portion uses an etching means which is capable of etching both the copper and the non copper metal of the cladding material. Thus, it is carried out through the selection of the etching liquid and processing conditions to be used by the combination of the copper and the non copper metal. Concretely, a means similar to that adopted in the normal circuit forming art can be adapted.

Although there is no problem as the copper is exposed on the surface including the solder potion in the outer lead portion at the stage with the above described step being completed, the non copper metal to constitute the inner lead forming portion is covered with copper in the inner lead forming portion.

No copper metallic layer of the inner lead forming portion is exposed with a selection etching operation where the copper is etched, but the non copper metal is not etched. The location which requires the copper layer, including at least solder portion among the outer lead portions is covered with a proper resist layer or the like so that the copper layer may be etched. A selection etching means in the normal circuit forming art may be adapted as the concrete etching means.

In the film material obtained by the above described method, the outer lead portions and the inner lead forming portion are covered in the whole on the surface of the film material so as to form the non copper metallic layer, and also, in at least the solder portion among the outer lead portions, the non copper metal layer is covered with the copper layer.

Further, a method of manufacturing a film material for film carrier manufacturing use in the present invention comprises the steps of, in the manufacturing operation of the film material for film carrier manufacturing use in accordance with the present invention, applying an etching operation upon the built in material with the non copper metallic layer which is lower in the reflection ratio with respect to the laser light than the copper being formed on the film so as to form in pattern the outer lead portions and the inner lead forming portion, thereafter, laminating the copper layer on at least the solder portion of the outer lead portion.

In order to form on the film the non copper metallic layer lower in the reflection ratio with respect to the laser light than the copper so as to manufacture the built in material, a method of pasting the non copper metallic foil on the film with foil made of the above described non copper metal being manufactured in advance, and a method of plating the non copper metal on the film are used, and in addition, a sputtering method, a vacuum evaporating method, and the other metallic thin film forming means may be adopted.

An ordinary circuit forming means as it is may be adapted as a method of etching the non copper metallic layer on the film. The outer lead portions and the inner lead forming portion are formed in the external shape in this manner. Although the inner lead portions of the non copper metal may remain, the copper layer is built in on at least the soldering portion among the outer lead portions. The plating or the sputtering, and the other normal thin film forming means may be adapted as a means for forming the copper layer. The proper resist layer is formed so that the surfaces of the inner lead forming portions may not be covered with the copper layer in the forming step of the copper layer. The copper layer is adapted to be formed only on the necessary location of the outer lead portions.

Even in the film material obtained as described hereinabove, the non copper metallic layer is formed on the surface of the film across the whole of the outer lead portions and the internal lead forming portion, as in the case of the invention of the above described second embodiment, and also, the non copper metallic layer is adapted to be covered with the copper layer in at least the soldering portion of the outer lead portions.

Further, according to the invention, the pattern formation of the lead pattern with respect to the film carrier is divided into the outer lead portions which are not changed by the electrode layout of the semiconductor chip, and the inner lead portions to be changed each time the electrode layout becomes different. As only the pattern formation of the outer lead portions is effected upon the film material for manufacturing the film carriers, the completely same ones may be used independently of the electrode layout of the semiconductor chip as the film material, and the mass production may be effected with efficiency. If only the pattern formation of the inner lead portions is worked by the laser working which can change the working patterns easily for each of the semiconductor chips different in the electrode layout with respect to the film material like that, it may be coped with extremely easily with changes in the electrode layout of the semiconductor chip.

In other words, if only the inner lead portions which change in the forming pattern are adapted to be effected by the laser working that is capable of free changes in the working patterns, with the pattern formation being performed efficiently and economically by- the etching method and so on, the normal circuit forming means in the outer lead portions which do not change in the forming pattern, the easier coping operation may be effected with respect to the changes in the electrode layout of the semiconductor chip without the reduction in the productivity of the film carrier, thus becoming an extremely high flexible film carrier manufacturing film material.

The soldering portion required for at least better soldering continuity among the outer lead portions is made of copper which is superior as a material of the conductive circuit, and also is superior in soldering connection property, so that the characteristics superior to copper may be exhibited. The inner lead forming portions which are necessary to effect the pattern formation of the inner lead portions by the laser working operation are made of non copper metal which is lower in the reflection ratio of the laser light and superior in the laser working property, thus improving the working efficiency.

Also, the filter material for manufacturing the film carriers in accordance with the present invention is a film material for manufacturing the film carriers where the respective electrodes of the semiconductor chip to be mounted on the above described film are connected through bumps onto the inner lead portions of the lead patterns formed on the film, among the lead patterns to be formed by the pattern formation from the conductive metallic layer on the above described film, the outer lead portions where the patterns are not changed by the electrode layout of the semiconductor chip to be mounted are pattern formed in advance, but the inner lead portions to be changed in the pattern by the electrode layout of the conductor chip to be mounted remain as the conductor metallic layer is without being formed in pattern, and becomes the inner lead forming portion, further the positioning mark portions are formed simultaneously with the pattern formation of the outer lead portions from the conductive metallic layer on the above described film.

In the present invention, the inner lead portions which are connected with the electrodes of the semiconductor chip remain covered in its whole with the conductive metallic layer without being pattern formed. The conductive metallic portion for forming the inner lead portions is called an inner lead forming portion. The inner lead portions mean portions where the pattern is required to be changed in accordance with the electrode layout of the semiconductor chip. The location where the pattern formation is not necessary to be changed by the electrode layout of the semiconductor chip if it is the inner side portion of the lead pattern is kept formed in pattern as in the above described outer lead portions.

Al, Ni, Au and the other circuit forming conductive metals in addition to the above described copper may be used as the conductive metallic layers forming the lead pattern, also, the conductive metal different depending upon the location of the lead pattern may be used, or a plurality of conductive metallic layers may be laminated.

Further, the positioning mark portions are kept formed at the same time with the pattern formation of the outer lead portions from the same conductive metallic layer in the different position from the outer lead portions and the inner lead forming portion. A shape which becomes a proper index to the positional alignment in both X Y directions of "+" mark, hook mark and so on is desired to be used as the shape of the positioning mark. The positional mark portion is kept formed by one or by plurality near the outer led portions and the inner lead forming portion. Concretely, if two positional mark portions are formed on diametrical lines in an open position between the outer lead portions in a plurality of directions extending onto the external sides of the inner lead forming portion, the extra position is not occupied, and also, the positive positioning may be effected.

The film material of the present invention is provided with the pattern patterns and the positioning marks of such construction.

A method of manufacturing film carriers with the use of such a film material as described hereinafter.

The pattern formation of the inner lead portions will be described in accordance with the electrode layout of the individual semiconductor chip to be mounted. The pattern formation of the inner lead portions is effected by the laser working operation. The working patterns of the laser working operation has only to control the application of the laser light ray by the program established in accordance with the electrode layout of the semiconductor chip in advance by the use of the NC working control apparatus and so on. The standard of the working patterns of the laser working operation is performed by the positioning mark portion to be formed on the film. Namely, the positioning mark portions are detected by a proper sensor such as optical sensor or the like. The laser light is moved, applied so that the inner lead portions may be formed in positions corresponding correctly to the outer lead portions with the positional information of the detected positioning mark portions a the basis. In order to detect the positioning mark portions and determine the application position of the laser light, the automatic control may be effected with the use of such a sensor as described hereinabove, the application position of the laser light or the engagement position of the film material may be adjusted while visually confirming the positioning mark portions displayed on the enlarged image apparatus or the like. The concrete laser working apparatus and working conditions are similar to the laser working in the normal semiconductor manufacturing, the wiring circuit manufacturing and so on.

The film carrier which has completed the pattern formation of the inner lead portions goes through a bump forming step of each electrode, a splice bonding step through the bumps between the inner lead portions and the electrodes of the semiconductor chip, a sealing step by resin, a punching, separating step with respect to the individual film carrier chip, and so on as in the normal semiconductor chip mounting method so as to manufacture the film carrier chip as the object. In the splice bonding step of the inner lead portions and the electrodes, the simple and correct positioning operation may be effected if the positional alignment between the inner lead portions and the electrodes of the semiconductor chip is effected with the use of the above described positioning mark portions. The positioning mark portions may be used as the positional alignment basis even at the other steps. If the positioning mark portions are not necessary to the film carrier chip manufactured finally, the positioning mark portions have only to be removed at the above described punching, separating step or the like. The pattern formation of the lead pattern with respect to the film carriers is divided into the outer lead portions which are not changed by the electrode layout of the semiconductor chip and the inner lead portions to be changed each time the electrode layout becomes different. As only the pattern formation of the outer lead portion is effected on the film material for manufacturing the film carrier, completely the same ones may be used as the film material independently of the electrode layout of the semiconductor chip, and the mass production may be effected efficiently. As only the pattern formation of the inner lead portions may be worked by the laser working which may be easily changed in the working patterns for each semiconductor chip different in the electrode layout with respect to such a film material, the coping operation may be extremely easily effected with respect to the changes in the electrode layout of the semiconductor chip.

In other words, the outer lead portions which remain unchanged in the forming pattern are pattern formed efficiently and economically by the etching method and so on, and the normal circuit forming means, with the inner lead portions only which change in the forming pattern being effected by the laser working which may freely change the working pattern, so that easier coping operation may be effected easily with respect to the changes in the electrode layout of the semiconductor chip without the reduction in the productivity of the film carriers, thus resulting in the film material for manufacturing film carriers which is extremely high in flexibility.

As the positioning mark portions are formed at the same time with the pattern formation of the outer lead portions, the pattern of the inner lead portions may be formed in a condition correctly aligned with the formation pattern of the outer lead portions if the application of the laser light is controlled with the positioning mark portions being provided as the basis when the pattern formation of the inner lead portions is effected by the laser application. When the positioning mark portions are formed with the same etching method as in the outer lead portions, the positional accuracy of the positioning mark portions becomes also as extremely accurate as ±2 μm if the working position accuracy of the general etching is approximately ±2 μm. Also, as the outer lead portions and the positioning mark portions are etched at the same time, the relative positional errors between them become extremely small if the respective positional errors with respect to the film material are provided.

Further, the positioning mark portions may be used as the positioning basis if it is necessary to know the position of the lead pattern correctly at the film carrier manufacturing step after it.

BRIEF DESCRIPTION OF THE DRAWINGS

These and other objects and features of the present invention will become apparent from the following description taken in conjunction with the preferred embodiment thereof with reference to the accompanying drawings, in which;

FIG. 2 (a) through (d) is a model sectional view showing the steps of sequentially manufacturing the film carriers;

FIG. 5 (a) through (c) is a model sectional view showing the steps of sequentially manufacturing the film carriers as modified embodiments of FIG. 2 (a) through (d) as a second embodiment of the present invention;

FIG. 6 (a), (b) shows the conventional wire bonding type of film carrier chip, FIG. 6 (a) is a sectional view, FIG. 6 (b) is a bottom view in a condition except for sealing resin; and FIG. 7 (a), (b) show the conventional bump type of film carrier chip, FIG. 7 (a) being a sectional view, FIG. 7 being a bottom view in a condition except for the sealing resin.

DETAILED DESCRIPTION OF THE INVENTION

Before the description of the present invention proceeds, it is to be noted that like parts are designated by like reference numerals throughout the accompanying drawings.

(First Embodiment)

Figure 1:
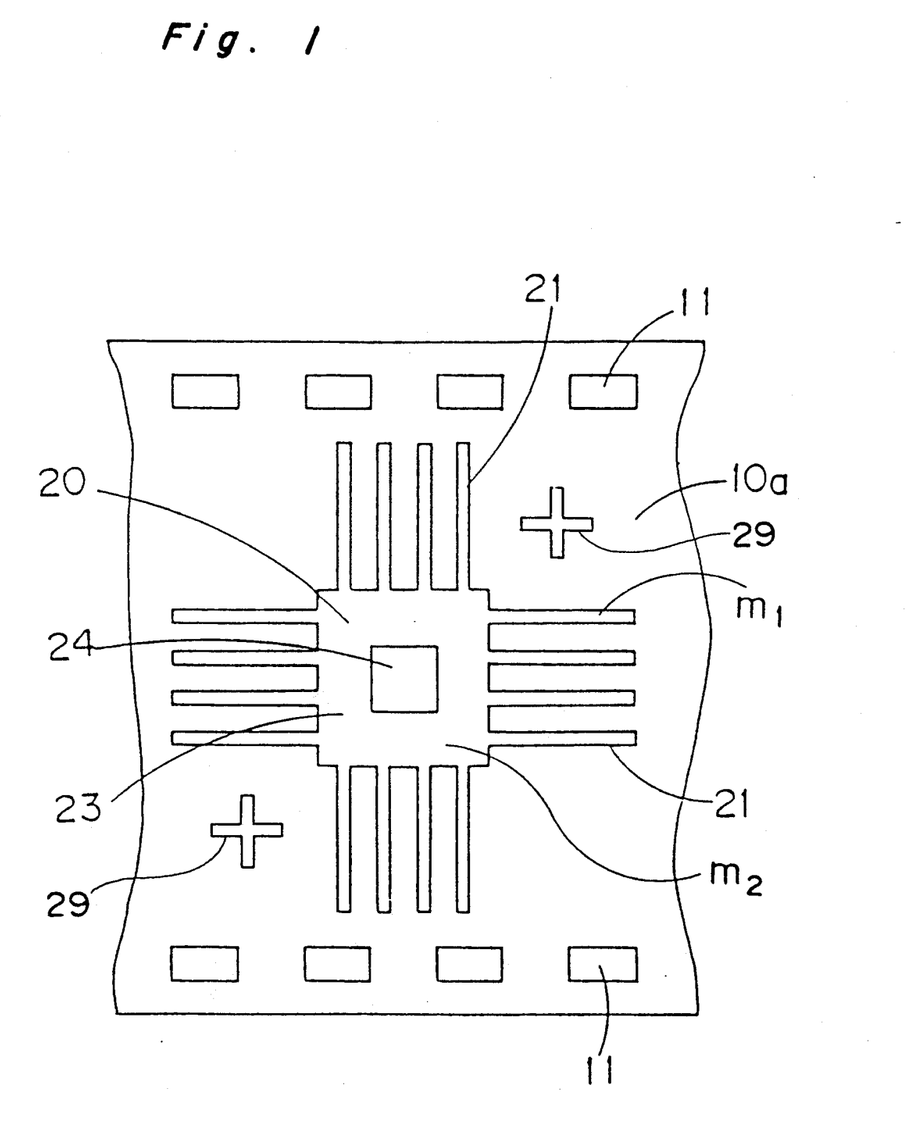
FIG. 1 is a plane view of a film material, before the inner lead portions are pattern formed, showing a first embodiment of the present invention.

FIG. 1 shows a film tape 10a which is a film material for manufacturing film carriers. The long film tape 10a has sprocket holes 11, 11 drilled through at constant intervals in both the ends of the width direction. The lead pattern 20 is removed, worked into a given pattern with an etching operation after the conductive metallic layer of copper or the like has been formed on the whole surface of the film tape 10a. The lead pattern 20 is composed of a long strip outer lead portions 21 extending in four directions, square shaped inner lead forming portion 23 positioned at the center of the outer lead portion 21. The construction of the outer lead portion 21 is similar to that of the conventional normal film carrier. As before, the inner lead forming portion 23 is not pattern formed for each of the respective electrodes, is formed in the whole into an integrally continuous shape. When the electrode layout of the semiconductor chip 30 has been changed, the inner lead forming portion 23 is provided with the whole location where the individual inner lead portions may be disposed being covered. A small square shaped hollow portion 24 is formed in the center of the inner lead forming portion 23. As there are few cases where the electrodes are set in the peripheral portion of the plane shape, and the electrodes are set in the central portion in the normal semiconductor chip 30, the inner lead portions are hardly formed as far as the central portion. If the hollow potion 24 is formed in the central portion in advance, the bother of working the inner lead portions to be described later may be reduced.

Among such shaped outer lead portions 21 and the inner lead forming portion 23, a copper layer m1 is exposed on the surface of the outer lead portion 21 and an Al layer m2 which becomes a non copper metallic layer is exposed on the surface of the inner lead forming portion 23.

The manufacturing of the film tape 10a, namely, of the film material for manufacturing the film carriers is completed when the lead pattern 20 as described hereinabove is formed. It is offered for the transportation, custody of sales in this condition.

Positioning mark portions 29, 29 are formed in two locations where they are provided oppositely in the extending direction of the diametrical lines of the inner lead portion 23. The positioning mark portion 29 forms "+" mark, and is formed by the etching operation of the conductive metallic layer at the same time with the outer lead portions 21 and the inner lead forming portion 23.

If such lead pattern 20 and the positional mark portions 29 as described hereinabove are formed, the manufacturing of the film tape 10a, namely, the film material for film carrier manufacturing use is completed, thus being offered for the transportation custody or the sales in this condition.

FIG. 2 shows a step of, in model, forming a lead pattern 20 on the film material such as film tape 10a or the like so as to manufacture the film material, and a step of mounting a semiconductor chip 30 on the manufactured film material.

As shown in FIG. 2 (a), an Al layer m2 and a copper layer m1 are laminated on the surface of the film 10. Concretely, a cladding material made of an Al layer m2 and a copper layer m1 is manufactured. The cladding material is pasted on the surface of the film 10 and is laminated.

As shown in FIG. 2 (b), the lead pattern 20 made of a conductive metallic layer is formed. Concretely, after the outer lead portion 21 and the inner lead forming portion 23 have been pattern etched with etching liquid which can etch both the Al layer m2 and the copper layer m1, only the copper layer m1 is etched. The copper layer m1 for covering the Al layer m2 of the inner lead portion forming portion 23 is removed from the Al layer m2 with the etching liquid which cannot effect the etching operation.

Figure 2A:
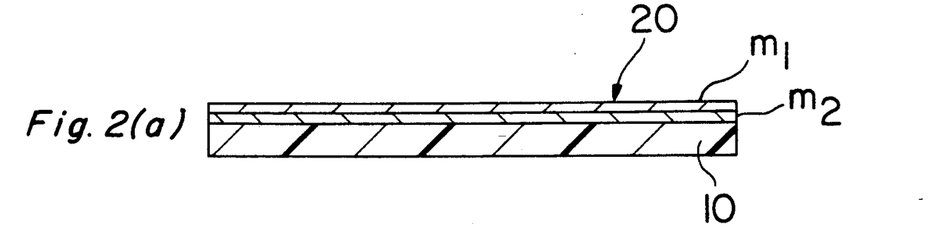
Figure 2B:
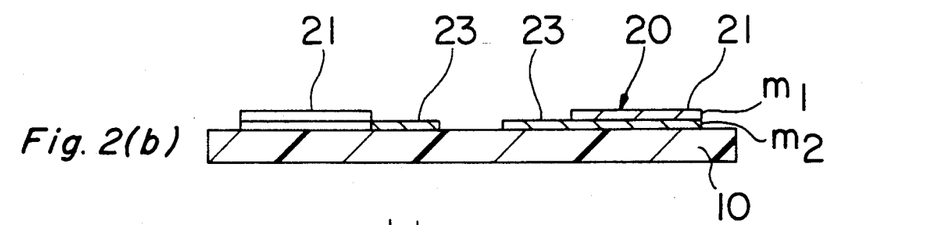
Figure 2C:
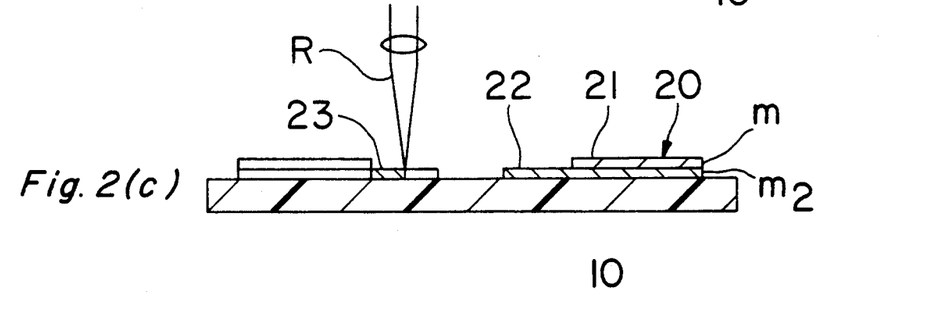
Figure 2D:
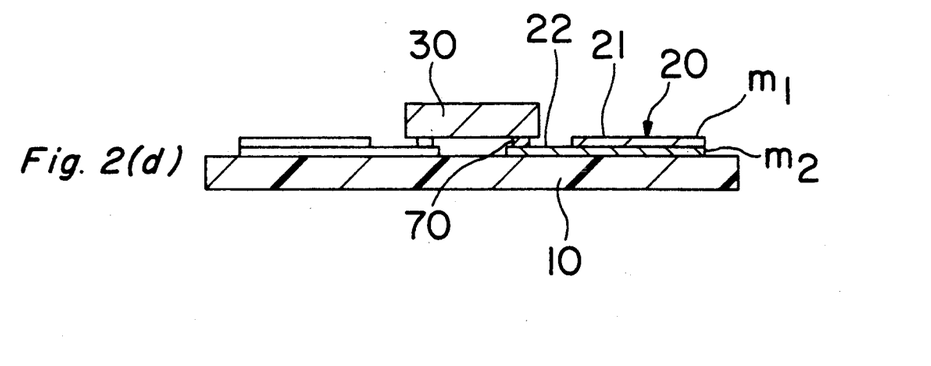

The inner lead forming portion 23 of the lead pattern 20 is pattern formed in accordance with the electrode layout of the semiconductor chip 30 to be mounted. As shown in FIG. 2 (c), the non copper metallic layer m2 of the inner lead forming portion 23 is removed through the application of the laser light ray R from above the lead pattern 20. By the controlling of the application pattern of the laser light ray R, the inner lead portion 22 provided with a desired pattern shape may be formed.

Figure 3:
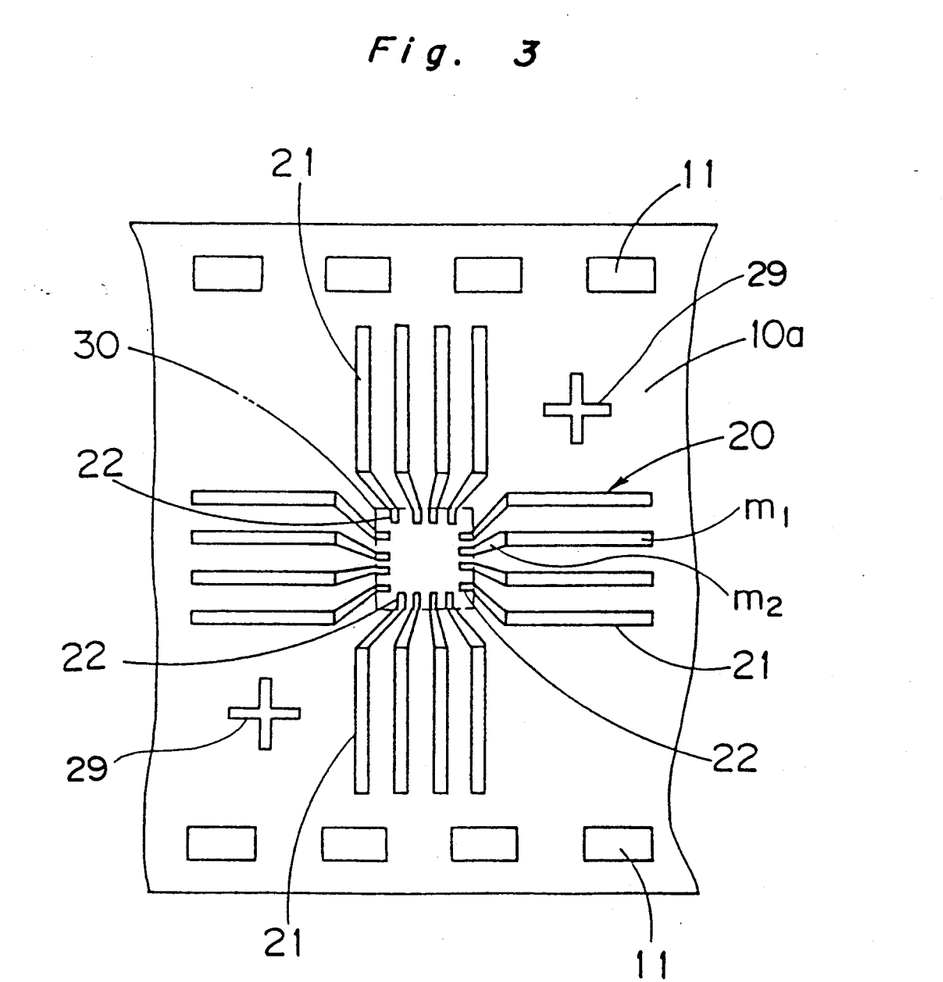
FIG. 3 is a plane view of a film carrier with the pattern formation of the inner lead portions being effected.
Figure 4:
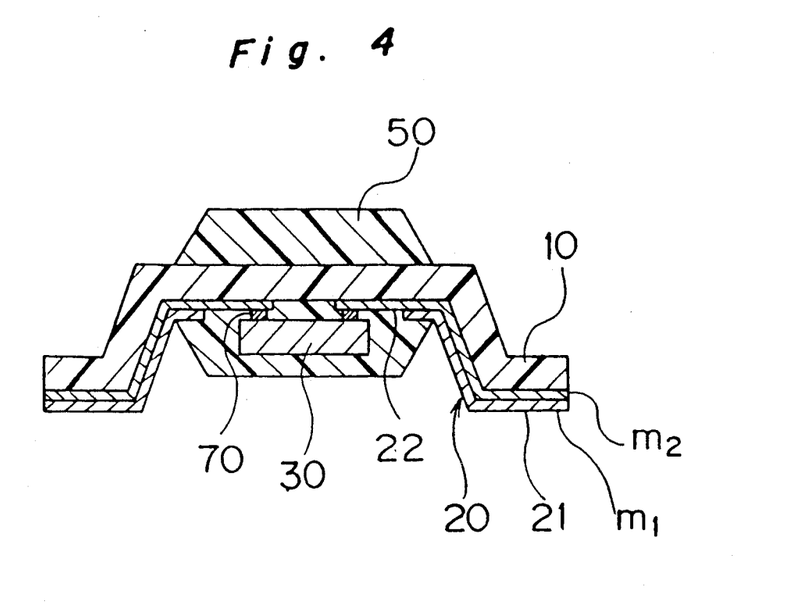
FIG. 4 is a sectional view of a manufactured film carrier chip.

FIG. 3 shows the construction of the inner lead portion 22 formed in this manner, where narrower wedge-shaped inner lead portions 22 are respectively provided continuously to the respective outer lead portions 21 arranged at comparatively wide intervals so that the chip ends of the inner lead portions 22 are adapted to be arranged on the respective electrode positions of the back face of the semiconductor chip 30. The inner lead portion 22 is formed with the Al layer m2, and the outer lead portions 21 has the copper layer m1 exposed on the surface with the Al layer m2 being covered with the copper layer m1. Thus, the film carriers pattern formed in the whole of the lead pattern 20 may be manufactured as shown in FIG. 4.

FIG. 2 (d) shows the condition where the semiconductor chip is mounted on the film carrier, where a semiconductor chip 30 is mounted through bumps 70 on the inner lead portion 22, the respective electrodes of the semiconductor chip 30 is fixedly connected with the respective inner lead portions 22 by the pressure and the heating. The means and steps of the concrete bump connection are carried out as in the conventional normal bump type of film carrier chip. When the Au is used for the bump 70 at this time, the mounting connection of the semiconductor chip 30 is easier to effect and the connection performance becomes also better, because the Al layer m2 of the inner lead portions 22, and the Au bump 70 are extremely superior in the splicing property.

Then, the mounting portion of the semiconductor chip 30 is sealed with resin, the peripheral portion of the film tape 10a is separated through the punching operation in the external peripheral portion of the lead pattern 20, the outer lead portion 21 of the lead pattern 20 is bent so as to be easily connected with the external periphery circuit as in the manufacturing method of the conventional normal film carrier chip. According to the film material for manufacturing the film carriers in accordance with the present invention, the film material common in all may be applied with respect to the various semiconductor chips which are different in the electrode layout, because the inner lead portions for bump connection use which are required to be changed each time the electrode layout of the semiconductor chip changes are not pattern formed, and are kept as the inner lead forming portion with the whole remaining covered with the conductive metallic layer. Therefore, the manufacturing apparatus for etching mask and model and so on have only to be of one type. The time and bother for making the etching mask again each time the electrode layout of the semiconductor chip changes may be removed, thus reducing the cost considerably, with extremely large effects in the improvement of the productivity property and the reduction in the production cost.

In order to effect the pattern forming operation of the inner lead portion, the laser working is effected in accordance with the electrode layout of the semiconductor chip. In the laser working, the free working pattern may be provided in accordance with the NC control program and so on, so that the easier and quicker coping operations simply by the variation in the working program so as to cope in accordance with the electrode layout with respect to the semiconductor chip having the optional electrode layout, thus resulting in extremely high flexibility. As the narrow range of the inner lead portions only requires the laser application, neither more working time of the whole nor the more bother is required, without worries that the productivity and economies of the whole are damaged.

Copper is used as the conductive metal which constitutes at least the solder portion of the outer lead portions, non copper metal is used which is lower in the reflection ratio of the laser light as the conductive metal layer which constitutes the inner lead forming portion, so that the working efficiency of the inner lead portions by the laser working becomes higher, becomes superior in productivity and at the same time, becomes superior even in the connection performance through the soldering with the external portion circuit. If a conductive metal is selected which is superior in the splicing property with the bump for splicing the electrodes of the semiconductor chip with the inner lead portions as the non copper metal for constituting the inner lead portions, the mounting connection of the semiconductor chip becomes easier and is improved in the connection performance as compared with the splicing of the inner lead portion composed of the copper.

Although the film carrier is a bump type of film carrier suitable for the higher density of the electrode layout, the smaller size of the semiconductor chip and so on, a film carrier may be manufactured which is provided with flexibility equivalent to the conventional wire bonding type or of more flexibility in the electrode layout of the semiconductor chip. Further, the laser working and so on of the inner lead portions, the manufacture of the firm carrier may be performed with ease and efficiency, and at the same time, the solder connecting property and so on with respect to the external portion circuit of the outer lead portions, the performance of the manufactured film carriers become superior, thus contributing greatly towards the demand expansion of the film career chip and the use expansion thereof.

(Second Embodiment)

Figure 5A:
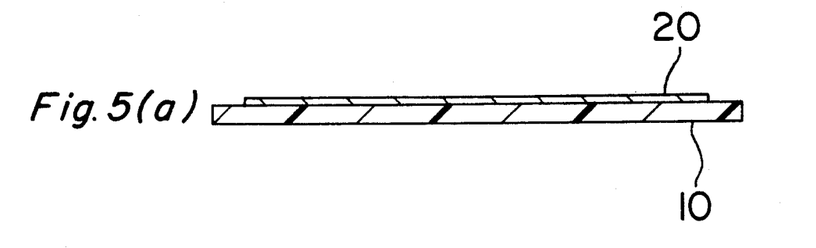

FIG. 5 shows with model another step of mounting the semiconductor chip 30 on the film material of the film tape 10a or the like as a modified embodiment of FIG. 2. As shown in FIG. 5 (a), a lead pattern 20 composed of conductive metallic layer and positioning mark portions 29 ( not shown) on the surface of the film 10. This condition is a condition of the above described FIG. 1.

Figure 5B:
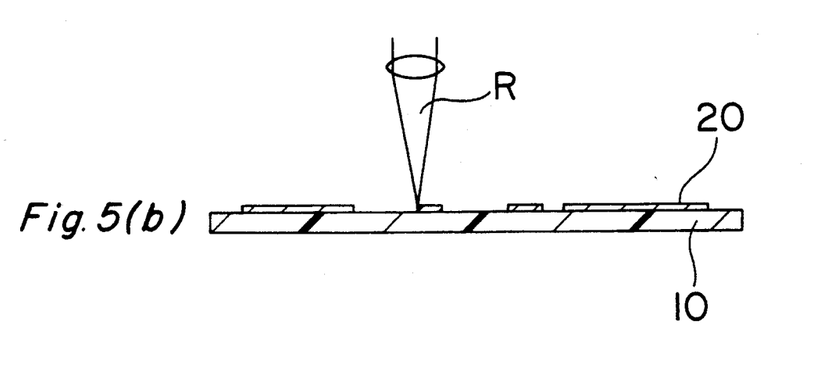

The inner lead forming portion 23 of the lead pattern 20 is pattern formed in accordance with the electrode layout of the semiconductor chip 30 to be mounted. As shown in FIG. 5 (b), the laser light ray R is applied from upon the lead patterns 20 so as to remove the conductive metallic layer of the inner lead forming portion 23. The application position of the laser light ray R is decided by the operational adjustment of the control mechanism of the laser light ray R or of the retaining mechanism of the film 10 in accordance with the detection information with the position of the positioning mark portions 29 being detected by a sensor. By the controlling of the application pattern of the laser light ray R, the inner lead portion 22 provided with the desired pattern shape may be formed.

FIG. 3 shows the construction of the inner lead portions 22 formed in this manner.

Figure 5C:
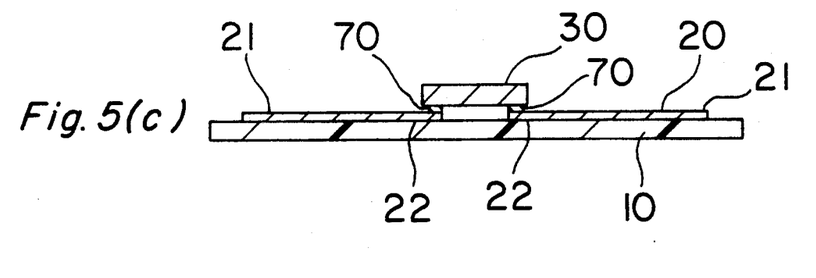

FIG. 5 (c) shows a condition where the semiconductor chip is mounted on the film carrier. A semiconductor chip 30 is mounted through the bumps 70 on the inner lead portions 22, with the respective electrodes of the semiconductor chip 30 and the respective inner lead portions 22 being fixedly connected by the pressures and the heating. The means and steps of the concrete bump connection are carried out as in the manufacturing method of the conventional normal bump type of film carrier chip.

Then, the mounting portion of the semiconductor chip 30 is sealed with resin, the peripheral portion of the film tape 10a is separated through the punching operation in the external peripheral portion of the lead pattern 20, the outer lead portions 21 of the lead pattern 20 is bent so as to be connected with the external periphery circuit as in the manufacturing method of the conventional normal film carrier chip.

According to the film material for manufacturing the film carriers in accordance with the present invention, the film material common in all may be applied with respect to the various semiconductor chips which are different in the electrode layout. because the inner lead portions for bump connection use which are required to be changed each time the electrode layout of the semiconductor chip changes are not formed, and are kept as the inner lead forming portion with the whole being covered with the conductive metallic layer. Therefore, the manufacturing apparatus for etching mask and model and so on has only to be of one type. The time and bother for making the etching mask again each time the electrode layout of the semiconductor chip changes are removed, thus reducing the cost considerably, with an extremely large effects in the improvement of the productivity property and the reduction in the production cost.

In order to effect the patter forming operation of the inner lead portion, the laser working is effected in accordance with the electrode layout of the semiconductor chip. In the laser working, the free working pattern may be provided in accordance with the NC control program and so on, so that the easier and quicker coping operations simply by the variation in the working program so as to cop in accordance with the electrode layout with respect to the semiconductor chip having the optional electrode layout, thus resulting in extremely high flexibility. As the narrow range of the inner lead portions only requires the laser application, neither more working time of the whole nor the more bother is required, without any worries that the productivity and the economies of the whole will be damaged.

Further, as the positioning mark portions are formed at the same time with the pattern forming of the outer lead portions, the laser working of the inner lead portions may be effected with the positioning mark portions being provided as the reference. the positional alignment of the outer lead portions and the inner lead portions to be pattern formed at the separate steps may be effected correctly and easily.

As the positioning mark portions are formed at the same time with the outer lead portions and so on, the extra operating step is not increased and the productivity is not reduced. If the positional mark portions have only to be formed in the optional position which does not interfere with the lead pattern on the film, and also, if it has only to be moved until the film carriers are completed, the necessary area of the film material does not increase, and the external shape of the manufactured film carrier chip does not become large in the external shape. Accordingly, the material cost of the film material and the manufacturing cost do not increase at all because of the formation of the positioning mark portion.

Although the film carriers are a bump type of film carriers suitable for the higher density of the electrode layout, the smaller size of the semiconductor chip and so on, film carriers may be manufactured which are provided with flexibility equivalent to the conventional wire bonding type or of more flexibility in the electrode layout of the semiconductor chip. Further, the productivity is also superior with the positional alignment of the outer lead portions and the inner lead portions pattern formed in the different steps being effective positively and easily, thus contributing greatly towards the demand expansion of the film career chip and the use expansion thereof.

Although the present invention has been fully described by way of example with reference to the accompanying drawings it is to be noted here that various changes and modifications will be apparent to those skilled in the art. Therefore, unless otherwise such changes and modifications depart from the scope of the present invention, they should be construed as included therein.

What is claimed is:

1. In a film material for a film carrier for mounting semiconductor chips, comprising a film wherein said film has mounted thereon leads having inner and outer portions, said semiconductor chips having electrodes to be mounted on said inner lead portion by bumps of conductive material, the improvement wherein said film carrier is provided with pattern formed outer lead portions having an inner and outer metallic layer, wherein said inner metallic layer has a smaller reflecting ratio to an etching laser light than said outer layer and non-pattern formed inner lead portions formed of said metal of said inner layer and capable of being laser etched to form an inner lead pattern corresponding to the electrode configurations of said semiconductor chip.

2. The film material of claim 1 wherein said outer layer is made of copper.

3. The film material of claim 1 wherein said inner layer is made of aluminum.

4. The film material of claim 1 wherein a a hollow area is provided proximate the center of said inner lead portion through which said film is exposed.

* * * * *